(12) United States Patent
Song

(10) Patent No.: US 7,645,413 B2
(45) Date of Patent: Jan. 12, 2010

(54) METHOD OF FORMING PATTERN

(75) Inventor: Tae Joon Song, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 43 days.

(21) Appl. No.: 11/987,066

(22) Filed: Nov. 27, 2007

(65) Prior Publication Data

US 2008/0157438 A1    Jul. 3, 2008

(30) Foreign Application Priority Data

Dec. 29, 2006   (KR) .................. 10-2006-0138218

(51) Int. Cl.
*B29C 43/02* (2006.01)
*B29C 59/02* (2006.01)
*B29C 43/56* (2006.01)

(52) U.S. Cl. .............. 264/319; 264/494; 264/293; 264/129; 264/337; 977/887

(58) Field of Classification Search .......... 264/319, 264/293, 494, 129, 337; 977/887
See application file for complete search history.

(56) References Cited

U.S. PATENT DOCUMENTS

| | | | | |
|---|---|---|---|---|
| 6,482,742 B1 * | 11/2002 | Chou | | 438/690 |
| 6,797,091 B2 * | 9/2004 | Lines et al. | | 156/87 |
| 7,204,686 B2 * | 4/2007 | Chung et al. | | 425/385 |
| 2004/0130057 A1 * | 7/2004 | Mehrabi et al. | | 264/171.13 |
| 2006/0222969 A1 * | 10/2006 | Jonoshita et al. | | 430/7 |
| 2006/0290026 A1 * | 12/2006 | Chae et al. | | 264/219 |
| 2007/0037465 A1 * | 2/2007 | Nutz et al. | | 442/376 |
| 2007/0134362 A1 * | 6/2007 | Heidari | | 425/385 |
| 2007/0138699 A1 * | 6/2007 | Wuister et al. | | 264/319 |
| 2007/0152372 A1 * | 7/2007 | Chae et al. | | 264/320 |
| 2007/0275114 A1 * | 11/2007 | Cherala et al. | | 425/405.1 |
| 2008/0003511 A1 * | 1/2008 | Nam et al. | | 430/5 |
| 2008/0277826 A1 * | 11/2008 | Chou et al. | | 264/293 |

* cited by examiner

*Primary Examiner*—Joseph S. Del Sole
*Assistant Examiner*—Nahida Sultana
(74) *Attorney, Agent, or Firm*—Holland & Knight LLP

(57) ABSTRACT

A method of forming a pattern is disclosed, which can improve the interfacial properties between a soft mold and a substrate including a pattern-formation material, the method comprising loading a substrate coated with a pattern-formation material into a chamber; positioning a soft mold, whose surface is provided with embossing and depressed patterns, in opposite to the substrate inside the chamber; forming an adsorption layer by evaporating some components of the pattern-formation material and adsorbing the components evaporated from the pattern-formation material to the surface of soft mold; forming a pattern layer with a shape being inverted to the embossing and depressed patterns included in the surface of soft mold by bring the soft mold including the adsorption layer into contact with the remaining pattern-formation material; and separating the soft mold from the pattern layer.

16 Claims, 9 Drawing Sheets

METHOD OF FORMING PATTERN

This application claims the benefit of Korean Patent Application No. 2006-138218 filed on Dec. 29, 2006, which is hereby incorporated by reference as if fully set forth herein.

BACKGROUND OF THE INVENTION

1. Field of the Invention

Embodiments of the present invention relate to a soft mold, and more particularly, to a method of fabricating a soft mold with the improved interfacial properties between the soft mold and a substrate including a pattern-formation material and a method of forming a thin film using the same.

2. Discussion of the Related Art

A fine-pattern formation process, for example, a process for forming an electric circuit is an important element which can determine the efficiency and capacity of device as well as a main element which can affect the properties of device.

Recently, there are various efforts to improve the efficiency and capacity of device, and more particularly, studies and researches in relation with the formation of fine pattern so as to improve the efficiency and capacity of device.

The fine-pattern formation process is necessary for flat panel display devices such as a printed circuit board (PCB), a liquid crystal display device (LCD), and a plasma display panel (PDP).

Various studies for formation of the pattern have been made, especially, a photolithography process using a photoresist is most generally used, which will be described as follows.

First, a photoresist layer having photosensitivity is coated on a metal layer, wherein the metal layer is formed on a substrate of a semiconductor material or an insulation material such as glass.

Then, a soft baking process is applied to the photoresist layer.

After an exposure mask having a light-transmission region and a light-shielding region defined therein is positioned above the photoresist layer, UV rays are applied to the photoresist layer through the exposure mask. Generally, the photoresist may be classified into a positive type and a negative type. For convenience of explanation, the case using the negative type photoresist will be explained as follows.

If UV rays are irradiated to predetermined portions of the negative type photoresist, the predetermined portions of the negative type photoresist, which are irradiated with the UV rays, are changed on their chemical structure.

Then, if the negative type photoresist is dipped into a vessel filled with a developer, a photoresist pattern is formed by removing the remaining portions of the negative type photoresist which are not irradiated with the UV rays.

Subsequently, after blocking some of a metal layer with the photoresist pattern, it is dipped into the developer. Then, a hard baking process is applied thereto, and then the metal layer except the portion below the photoresist pattern is etched to thereby form a metal pattern.

According as the photoresist pattern is removed by a stripper, only the metal pattern remains on a substrate.

At this time, a semiconductor layer, an insulation layer or other conductive layers instead of the metal layer may be etched.

However, the related art fine-pattern formation method using the photoresist has the following disadvantages.

First, the process becomes complicated due to the resist coating, the soft and hard baking for the coated resist, and the exposure and development. Furthermore, for baking the photoresist, it necessarily requires both the soft baking performed at a first temperature, and the hard baking performed at a second temperature which is higher than the first temperature of the soft baking, which causes the more complicated process.

Also, the fabrication cost is increased. In general, the process for the electric device including a plurality of patterns (or electrodes) is provided with a first photoresist step to form one pattern and a second photoresist step to form another pattern. This means that the expensive resist process line is required between each of the pattern lines. Thus, the fabrication cost for the electric device is increased.

Third, it may cause environmental contamination. Since the resist coating is generally performed by spin coating, the amount of resist disused on the coating process is increased, whereby it may cause the environmental contamination as well as the increasing fabrication cost.

Fourth, there are the defective devices. When forming a resist layer by the spin coating, it is difficult to control the precise thickness of resist layer. Accordingly, the thickness of resist layer is not uniform so that un-stripped resist portions remain on the surface of the pattern formed, thereby causing the defective devices.

In order to overcome the problems of the above-mentioned patterning method using photolithography, a new patterning method using a soft mold will be explained as follows.

First, a master is prepared so as to obtain a predetermined shape in a surface of a soft mold by an embossing or depressed pattern.

For example, a primary layer is formed by depositing an insulation material such as silicon nitride $Si_3N_4$ or silicon oxide $SiO_2$ on an insulation substrate such as silicon substrate. Then, a photolithography process is applied to the primary layer, whereby the primary layer is formed as a desired pattern.

At this time, the above-mentioned pattern of the insulation substrate may be formed of metal, photoresist or wax as well as silicon nitride or silicon oxide. Through the above-mentioned process, the master is completed.

On completion of the master, a pre-polymer layer is formed on the master.

Then, the pre-polymer layer is cured.

Next, the cured pre-polymer layer is referred to as a soft mold. As the soft mold is stripped off from the master, the embossing and depressed pattern is formed in the surface of the soft mold.

The soft mold is used to form a micro-unit fine pattern (pattern formed by the embossing or depressed shape of the soft mold). For example, the soft mold may be used for a color filter of a color filter substrate or an electrode of an OLED device.

The soft mold may be fabricated by curing an elastic polymer, for example, PDMS (polydimethylsiloxane) typically. In addition to PDMS, polyurethane or polyimide may be used.

The soft mold may be applied to various fields of soft lithography, soft molding, capillary force lithography and In-Plane printing.

Hereinafter, a patterning method using a mold according to the related art will be described with reference to the accompanying drawings.

FIGS. 1A to 1D are cross section views of illustrating a method of forming a pattern according to the related art.

As shown in FIG. 1A, a first material layer 11 is deposited on a substrate 10, and a pattern material layer 12 for a desired pattern is coated on the first material layer 11 by an inkjet apparatus or a dispenser 20.

Referring to FIG. 1B, a soft mold 31 is comprised of a lower surface of flat type and an upper surface having embossing and depressed shapes. The soft mold 31 is positioned above the pattern material layer 12. Also, the lower surface of flat type of the soft mold 31 is put on a backplane 30.

As shown in FIG. 1C, after aligning the soft mold 31 and the substrate 10, the upper surface of the soft mold 31 is brought into contact with the pattern material layer 12, whereby the embossing and depressed shapes of the soft mold 31 are stamped on the pattern material layer 12. As a result, the depressed shapes of the soft mold 31 remain on the pattern material layer 12, thereby forming a pattern layer 12a. At this time, in state of that the soft mold 31 is brought into contact with the pattern material layer 12, the pattern material layer 12 is cured by ultraviolet rays UV. In another aspect, the pattern material layer 12 may be cured by heat.

As shown in FIG. 1D, the soft mold 31 is separated from the surface of first material layer 11 provided with the pattern layer 12a.

FIGS. 2A and 2B illustrate shrinkage of resin after aligning the soft mold and the substrate in the method of forming the pattern according to the related art.

As shown in FIG. 2A, the pattern material layer 12 such as resin is coated adjacent to the edge of the first material layer 11 on the substrate 10. Then, the contact process shown in FIG. 1C is carried out between the substrate 10 and the soft mold 31. Since the soft mold 31 and the pattern material layer 12 have the different interfacial properties as shown in FIG. 2B, the pattern material layer 12 positioned at the circumference may shrink due to the repulsive force of soft mold 31 and the surface tension of pattern material layer 12, whereby the deformation (12x) of pattern material layer 12 may occur.

If the deformation (12x) of pattern material layer occurs, it may cause the failure of contact between the soft mold 31 and the circumferential part of pattern material layer corresponding to the deformation (12x). As a result, it is difficult to realize patterning of the pattern material layer with the uniform thickness, thereby causing the defective pattern.

SUMMARY OF THE INVENTION

Accordingly, embodiments of the present invention is directed to a method of fabricating a soft mold and a method of forming a thin film using the above soft mold that substantially obviate one or more problems due to limitations and disadvantages of the related art.

An object of embodiments of the present invention is to provide a method of fabricating a soft mold with the improved interfacial properties between the soft mold and a substrate including a pattern-formation material and a method of forming a thin film using the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of forming a pattern comprises loading a substrate coated with a pattern-formation material into a chamber; positioning a soft mold, whose surface is provided with embossing and depressed patterns, in opposite to the substrate inside the chamber; forming an adsorption layer by evaporating some components of the pattern-formation material and adsorbing the components evaporated from the pattern-formation material to the surface of soft mold; forming a pattern layer with a shape being inverted to the embossing and depressed patterns included in the surface of soft mold by bring the soft mold including the adsorption layer into contact with the remaining pattern-formation material; and separating the soft mold from the pattern layer.

Further, the method includes aging the adsorption layer after formation of the adsorption layer.

At this time, the adsorption layer is formed at a uniform thickness on the surface of the soft mold.

Also, the adsorption layer corresponds to about 5%~20% of the entire amount of pattern-formation material coated on the substrate.

Forming the adsorption layer is carried out with the decrease of pressure by discharging air inside the chamber to the external. The chamber includes a pressure-reducing device.

Forming the adsorption layer is carried out by heating the substrate inside the chamber. At this time, a hot plate is provided in a predetermined portion of the chamber on which the substrate is mounted.

Forming the adsorption layer is performed in state of maintaining the surface of soft mold and the surface of pattern-formation material on the substrate at a predetermined interval therebetween.

At this time, the pattern-formation material on the substrate is provided at an interval of 1 mm to 3 cm from the soft mold.

The pattern layer is photo-cured when forming the pattern layer with the shape being inverted to the embossing and depressed patterns included in the surface of soft mold by bring the soft mold including the adsorption layer into contact with the remaining pattern-formation material.

The pattern layer formed by photo-curing includes an adsorption layer on the surface of soft mold, and the remaining pattern-formation material on the substrate.

One of the pattern-formation material and the soft mold has the hydrophilic interfacial property, and the other thereof has the hydrophobic property.

At this time, the pattern-formation material is comprised of hydrophilic liquid pre-polymer of photo-curable property, photo-initiator and surfactant.

The soft mold is formed of PDMS(polydimethylsiloxane) or polyurethane.

The hydrophilic liquid pre-polymer of photo-curable property includes at least any one of HEA(2-Hydroxyehyl acrylate), EGDMA(Ethyleneglycol dimethancrylate), EGPEA (Ethyleneglycol phenyletheracrylate), HPA(Hydroxypropyl acrylate), and HPPA(Hydroxyl phenoxypropyl acrylate).

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to exemplary embodiments of the present invention, which are illustrated in the accompanying drawings. Wherever possible, the same reference numbers will be used throughout the drawings to refer to the same or like parts.

Hereinafter, a method of forming a pattern according to the preferred embodiments of the present invention will be explained with reference to the accompanying drawings.

FIRST EMBODIMENT

In a pattern-formation method using a soft mold, when the surface of soft mold is brought into contact with a pattern material layer on a substrate, the pattern material layer may shrink due to the different interfacial properties between the pattern material layer on the substrate and the surface of soft mold. For example, PDMS (polydimethylsiloxane) included in the soft mold has the hydrophobic property in its surface and resin included in the pattern material layer has the hydrophilic property.

In consideration for the different interfacial properties between the resin included in the pattern material layer and the surface of soft mold, the pattern-formation method according to the first embodiment of the present invention carries out adsorption for some components included in the pattern material layer on the substrate to the surface of soft mold.

Figure 1A:
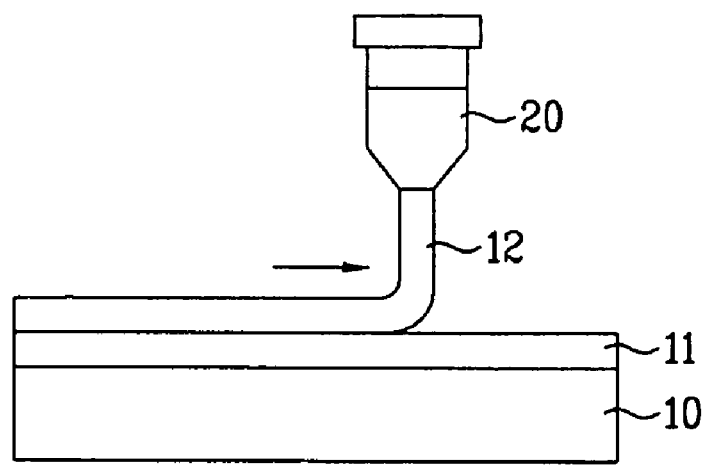
FIGS. 1A to 1D are cross section views of illustrating a method of forming a pattern according to the related art.
Figure 1B:
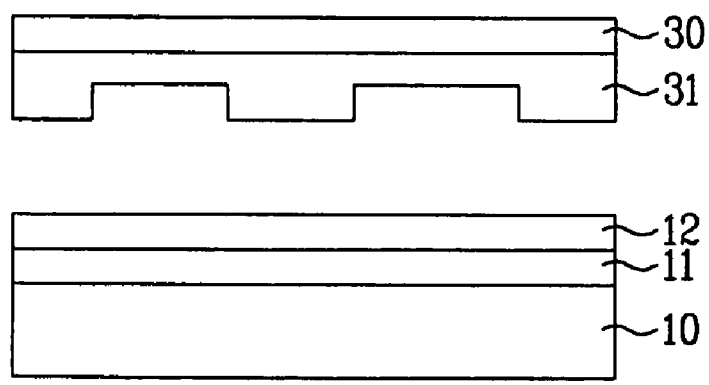
Figure 1C:
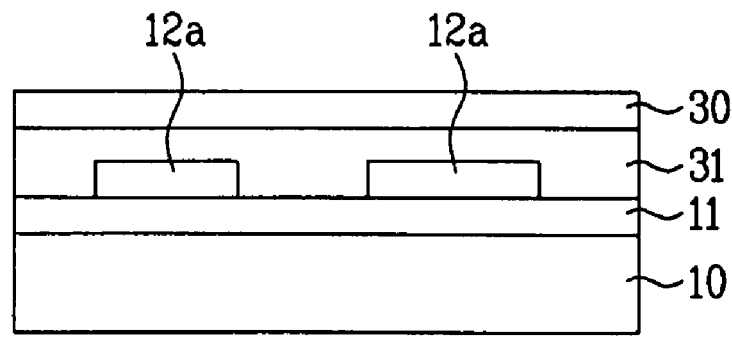
Figure 1D:
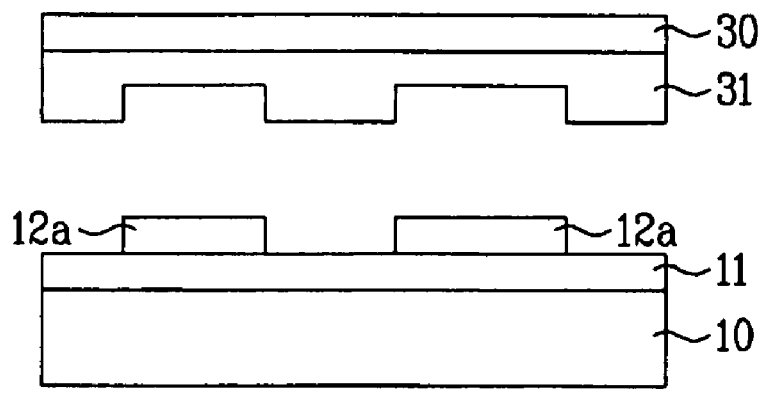
Figure 2A:
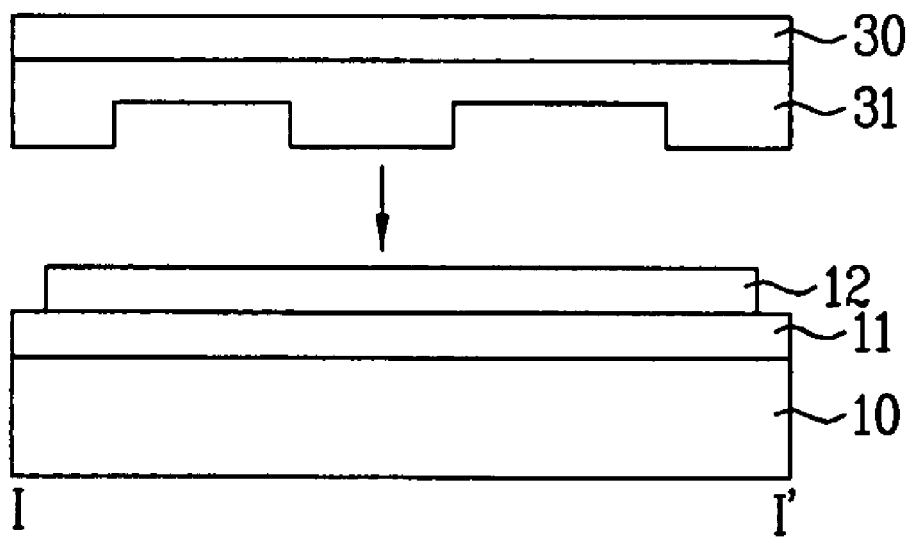
FIGS. 2A and 2B illustrate shrinkage of resin after aligning a soft mold and a substrate in a method of forming a pattern according to the related art.
Figure 2A:
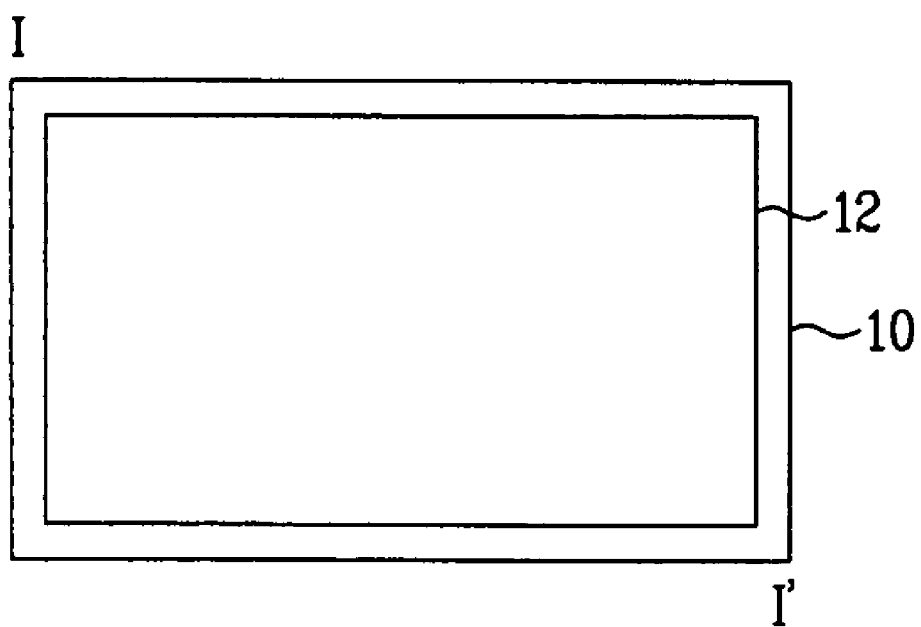
Figure 2B:
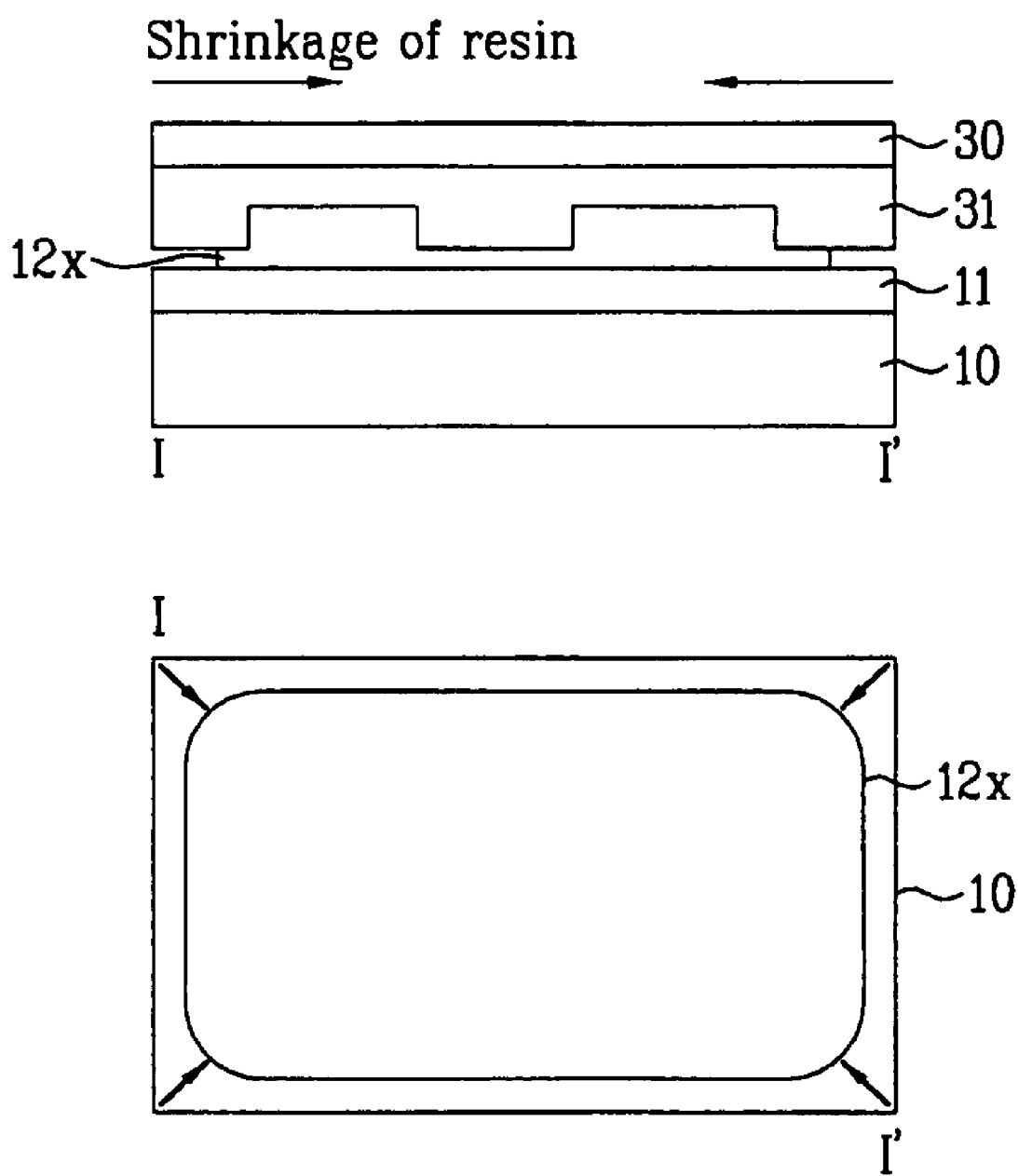
Figure 3A:
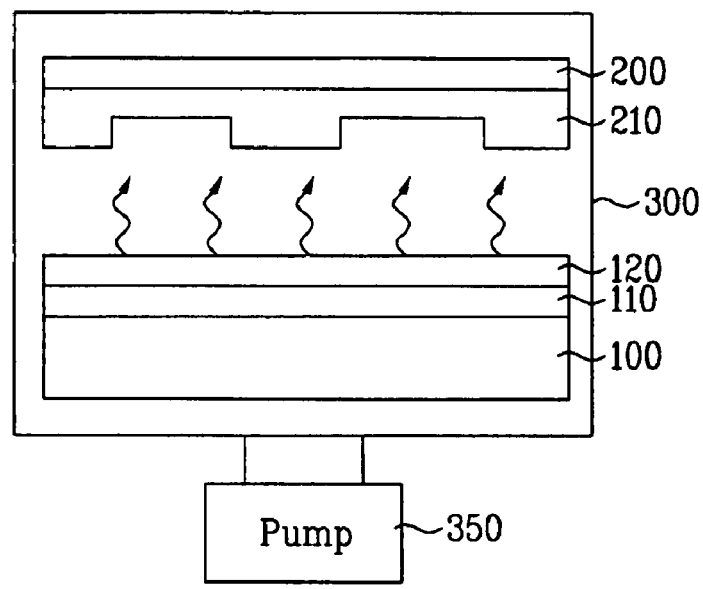
FIGS. 3A and 3B are cross section views of illustrating preliminary treatments before a contact step between a soft mold and a substrate in a pattern-formation method according to the first embodiment of the present invention.
Figure 3B:
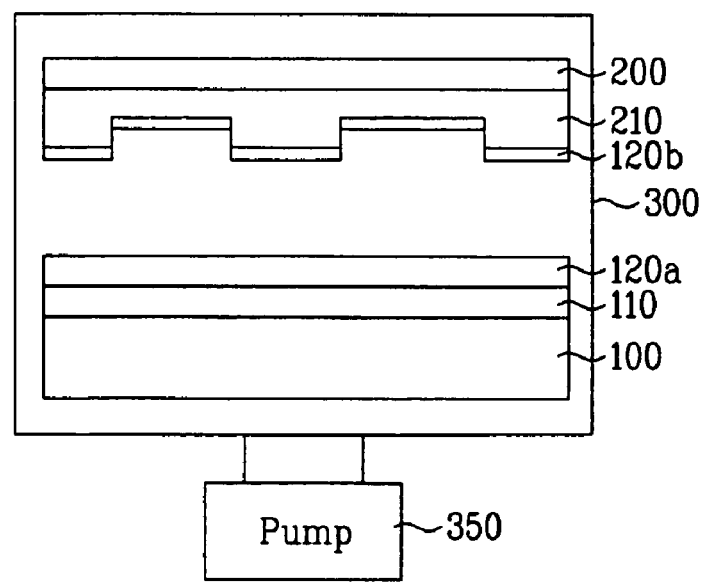

FIGS. 3A and 3B are cross section views of illustrating preliminary treatments before a contact step between a soft mold and a substrate in a pattern-formation method according to the first embodiment of the present invention.

As shown in FIG. 3A, after preparing a substrate 100, a first material layer 110 is formed on the substrate 100. Then, the first material layer 110 is coated with a pattern-formation material 120 including liquid pre-polymer which is photo-curable. At this time, the first material layer 110 on the substrate 100 may be formed in a single-layered structure as shown in FIG. 3A, may be formed in a multi-layered structure, or may be omitted. For example, if forming a black matrix layer included in a liquid crystal display device, the pattern-formation material 120 is directly coated without the first material layer 110. If forming a color filter included in the liquid crystal display device, the first material layer may be a black matrix layer.

Then, a soft mold 210 is prepared, wherein a flat rear surface of the soft mold 210 is attached to a backplane 200, and a front surface of the soft mold 210 is provided with embossing and depressed patterns. At this time, the pattern-formation material 120 and the soft mold 210 have the different interfacial properties. That is, one of the pattern-formation material 120 and the soft mold 210 has the hydrophilic interfacial property, and the other thereof has the hydrophobic interfacial property.

Supposing that the pattern-formation material 120 has the hydrophilic interfacial property and the soft mold 210 has the hydrophobic interfacial property. That is, the soft mold 210 is made of PDMS (polydimethylsiloxane) or polyurethane. The pattern-formation layer 120 is comprised of hydrophilic liquid pre-polymer of photo-curable property, photo-initiator and surfactant. At this time, the hydrophilic liquid pre-polymer of photo-curable property, which occupies 80%~98% of the pattern-formation layer 120, is typically formed of hydrophilic acrylate pre-polymer of photo-curable property, for example, HEA(2-Hydroxyehyl acrylate), EGDMA(Ethyleneglycol dimethancrylate), EGPEA(Ethyleneglycol phenyletheracrylate), HPA(Hydroxypropyl acrylate), and HPPA (Hydroxyl phenoxypropyl acrylate).

After loading the soft mold 210 and the pattern-formation material 120 of the substrate 100 into the inside of a chamber 300, the soft mold 210 is positioned at a predetermined interval from the pattern-formation material 120 on the substrate 100. At this time, the chamber 300 includes a pressure-reducing device such as a pump 350 which discharges the inner gas of the chamber 300 to the external. Accordingly, components in the surface of pattern-formation material 120 evaporate by the pump 350 included in the chamber 300. Referring to FIG. 3B, the components evaporated from the pattern-formation material 120 are adsorbed to the surface of soft mold 210, thereby forming an adsorption layer 120b on the surface of soft mold 210. In this case, the remaining components 120a of pattern-formation material except the evaporated components for the adsorption layer 120b are left on the first material layer 110.

After forming the adsorption layer 120b, an aging step is carried out, which maintains a predetermined period of time to realize the adsorption layer 120b with a uniform thickness on the surface of soft mold 210. The adsorption layer 120b corresponds to about 5%~20% of the entire amount of pattern-formation material 120 coated on the substrate 100.

On the evaporation process of pattern-formation material 120, the components of pattern-formation material 120 having low vapor pressure are firstly evaporated and adsorbed to the surface of the soft mold 210. At this time, the evaporated components of pattern-formation material 120 travel upward straightly. Thus, the pattern-formation material 120 is adsorbed more smoothly to the horizontal surfaces of the embossing and depressed patterns than the vertical sides of the depressed patterns.

When forming the adsorption layer 120b, the pattern-formation material 120 of the substrate 100 is provided at an interval of 1 mm to 3 cm from the soft mold 210.

Before the soft mold 210 is brought into contact with the pattern-formation material 120, the components of pattern-formation material 120 are adsorbed to the surface of soft mold 210 by evaporation. On the following contact process, the pattern-formation material 120 and the soft mold 210 have the same interfacial properties, thereby preventing the shrinkage of pattern-formation material 120. As a result, the conformity of contact improves, thereby preventing the defective patterns.

SECOND EMBODIMENT

Figure 4A:
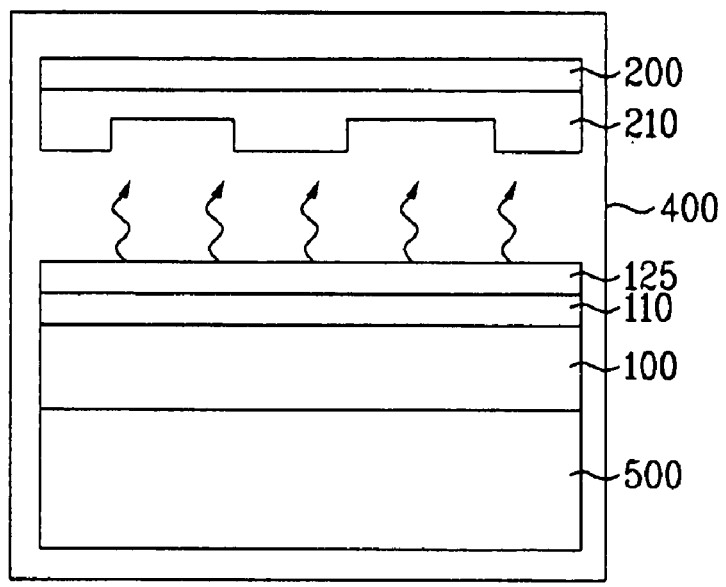
FIGS. 4A and 4B are cross section views of illustrating preliminary treatments before a contact step between a soft mold and a substrate in a pattern-formation method according to the second embodiment of the present invention.
Figure 4B:
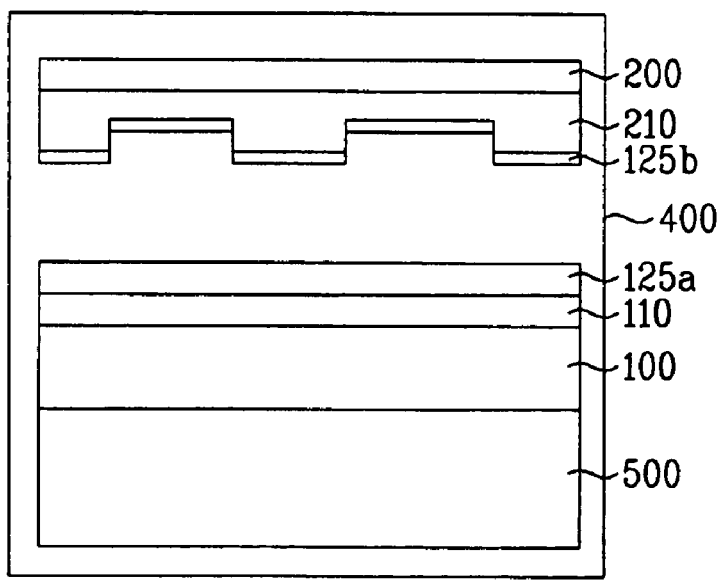

FIGS. 4A and 4B are cross section views of illustrating preliminary treatments before a contact step between a soft mold and a substrate in a pattern-formation method according to the second embodiment of the present invention.

The pattern-formation method according to the second embodiment of the present invention uses a hot plate 500 instead of the pressure-reducing device used for the pattern-formation method according to the first embodiment of the present invention. That is, the hot plate 500 is used to heat the air inside a chamber 400 in the pattern-formation method according to the second embodiment of the present invention. In this case, a soft mold 210, a first material layer 110 on a substrate 100 and components and interfacial properties of a pattern-formation material 125 provided in the pattern-formation method according to the second embodiment of the present invention are identical to those of the first embodiment of the present invention.

According as the inside of chamber 400 is heated by the hot plate 500, as shown in FIG. 4B, components of pattern-formation material 125, having low vapor pressure, are firstly evaporated, and then adsorbed to the surface of soft mold 210, thereby forming an adsorption layer 125b on the surface of the soft mold 210. After forming the adsorption layer 125b, remaining components 125a of the pattern-formation material are left on the first material layer 110.

Hereinafter, a method of forming the pattern according to the present invention will be explained with reference to the accompanying drawings.

Figure 5A:
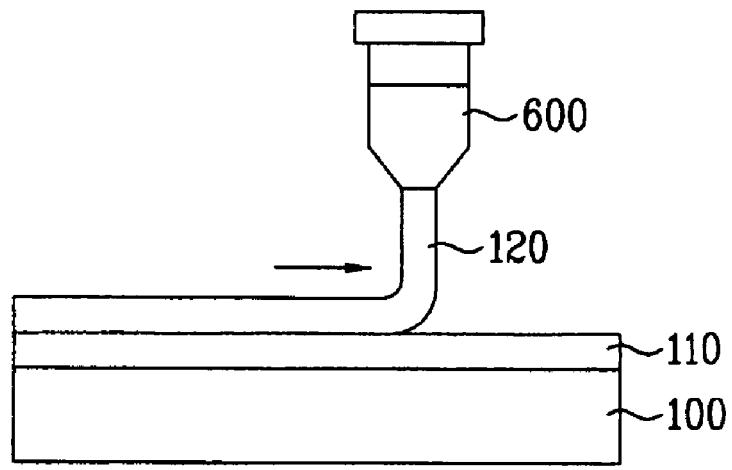
FIGS. 5A to 5E are cross section views of illustrating a pattern-formation method according to the present invention.
Figure 5B:
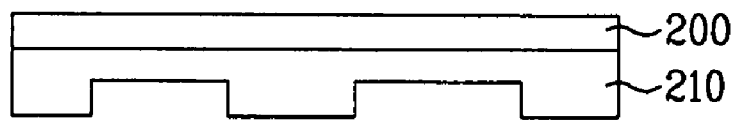
Figure 5B:
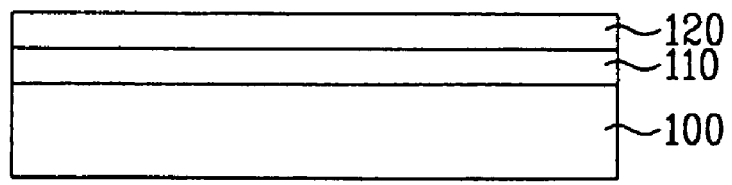
Figure 5C:
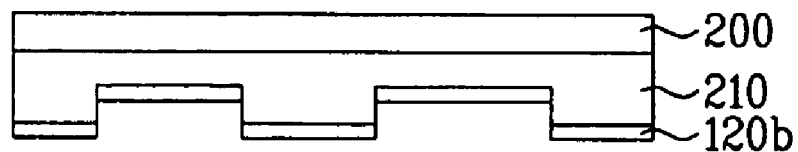
Figure 5D:
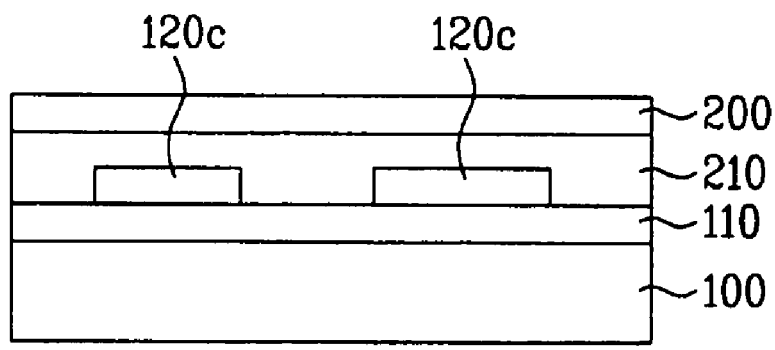
Figure 5E:
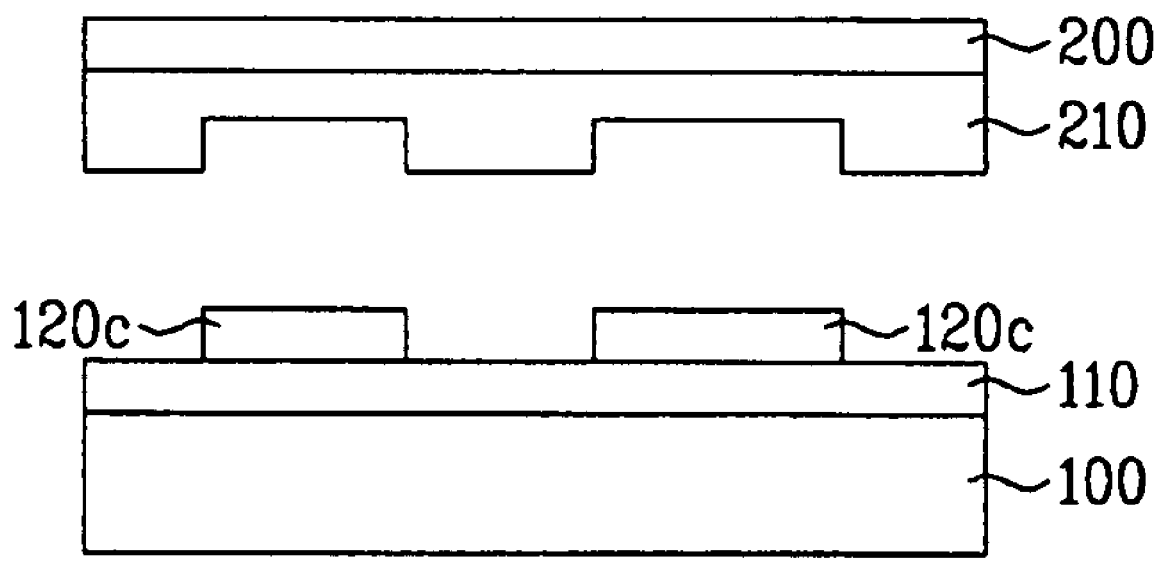

FIGS. 5A and 5E are cross section views of illustrating a method of forming the pattern according to the present invention.

First, as shown in FIG. 5A, in the method of forming the pattern according to the present invention, the first material layer 110 is deposited on the substrate 100. Then, the pattern-formation material 120 is coated onto the first material layer 110 by an inkjet apparatus or a dispenser 600.

Referring to FIG. 5B, the soft mold 210 is prepared, which includes the flat rear surface of the soft mold 210 is attached to the backplane 200, and the front surface of the soft mold 210 is provided with the embossing and depressed patterns.

As shown in FIG. 5C, after the soft mold 210 with the hydrophobic interfacial properties and the pattern-formation material 120 with the hydrophilic interfacial properties are loaded into the chamber ('300' of FIG. 3A), the soft mold 210 is positioned at a predetermined interval from the pattern-formation material 120 on the substrate 100.

The chamber 300 may be provided with the pressure-reducing device such as the pump 350 of FIG. 3A which can discharge the inner gas of the chamber 300 to the external, or may be provided with the hot plate of FIG. 4A which can heat the inside of the chamber to a predetermined temperature. On the process of positioning the pattern-formation material 120 and the soft mold 210 at the predetermined interval therebetween, the components in the surface of pattern-formation material 120 are evaporated and adsorbed to the surface of soft mold 210, thereby forming the adsorption layer 120b on the surface of the soft mold 210. In this case, the remaining components 120a of pattern-formation material except the evaporated components for the adsorption layer 120b are left on the first material layer 110.

After forming the adsorption layer 120b, an aging step is carried out, which maintains a predetermined period of time to realize the adsorption layer 120b with a uniform thickness on the surface of soft mold 210. The adsorption layer 120b corresponds to about 5%~20% of the entire pattern-formation material 120 coated on the substrate 100. When forming the adsorption layer 120b, the pattern-formation material 120 of the substrate 100 is provided at an interval of 1 mm to 3 cm from the soft mold 210.

Before the soft mold 210 is brought into contact with the pattern-formation material 120, the components of pattern-formation material 120 are previously adsorbed to the surface of soft mold 210 by evaporation. On the following contact process, the pattern-formation material 120 and the soft mold 210 have the same interfacial properties, thereby preventing the shrinkage of pattern-formation material 120 caused by the repulsive force between the pattern-formation material 120 and the soft mold 210. As a result, the conformity of contact improves, thereby preventing the defective patterns.

As shown in FIG. 5D, aligning the soft mold 210 and the substrate 100, the soft mold 210 whose surface is provided with the adsorption layer 120b is brought into contact with the surface of the remaining pattern-formation material 120a, and the embossing and depressed patterns included in the soft mold 210 are stamped on the remaining pattern-formation material 120a. Thus, a pattern layer 120c is formed with the remaining pattern-formation material 120a which is left in the depressed patterns of the soft mold 210. That is, the pattern layer 120c is formed as an inverted shape to the embossing and depressed patterns included in the soft mold 210.

In this case, the pattern layer 120c includes the remaining pattern-formation material 120a and the adsorption layer 120b. When the soft mold 210 is brought into contact with the remaining pattern-formation material 120a, the remaining pattern-formation material 120a is combined with the adsorption layer 120b, and is cured by UV rays, thereby completing the pattern layer 120c. If the pattern-formation material 120 includes a thermal initiator and a thermal-curing material, the pattern-formation material 120 may be cured by heat.

As shown in FIG. 5E, the soft mold 210 is separated from the surface of first material layer 110 including the pattern layer 120c therein.

Through the aforementioned process, it is possible to obtain the pattern layer 120c remaining on the first material layer 110 of the substrate 100.

The pattern-formation method according to the present invention may be applicable to a patterning process for a black matrix layer, a color filter layer or a column spacer included in a liquid crystal display device, and may be applicable to a patterning process for an organic light-emitting layer included in an OLED device.

As mentioned above, the pattern-formation method according to the present invention has the following advantages.

When performing the formation of pattern through the contact between the soft mold and the pattern-formation material having the different interfacial properties, the adsorption layer is previously formed on the surface of soft mold by evaporating the components included in the surface of pattern-formation material. Thus, it is possible to prevent the repulsive force between the soft mold and the pattern-formation material on the contact process therebetween. As a result, it is possible to prevent the pattern-formation material from shrinking during the contact with the soft mold, thereby preventing the defective pattern caused by low conformity of contact, and enabling the realization of precise pattern.

It will be apparent to those skilled in the art that various modifications and variations can be made in the embodiments of the present invention without departing from the spirit or scope of the invention. Thus, it is intended that the present invention covers the modifications and variations of the embodiments provided they come within the scope of the appended claims and their equivalents.

What is claimed is:

1. A method of forming a pattern comprising:
loading a substrate coated with a pattern-formation material into a chamber;
positioning a soft mold, whose surface is provided with embossing and depressed patterns, in opposite to the substrate inside the chamber;
forming an adsorption layer by evaporating some components of the pattern-formation material and adsorbing the components evaporated from the pattern-formation material to the surface of soft mold;
forming a pattern layer with a shape being inverted to the embossing and depressed patterns included in the surface of soft mold by bring the soft mold including the adsorption layer into contact with the remaining pattern-formation material; and
separating the soft mold from the pattern layer.

2. The method of claim 1, further comprising aging the adsorption layer after formation of the adsorption layer.

3. The method of claim 1, wherein the adsorption layer is formed at a uniform thickness on the surface of the soft mold.

4. The method of claim 1, wherein the adsorption layer corresponds to about 5%~20% of the entire amount of pattern-formation material coated on the substrate.

5. The method of claim 1, wherein forming the adsorption layer is carried out with the decrease of pressure by discharging air inside the chamber to the external.

6. The method of claim 5, wherein the chamber includes a pressure-reducing device.

7. The method of claim 1, wherein forming the adsorption layer is carried out by heating the substrate inside the chamber.

8. The method of claim 7, wherein a hot plate is provided in a predetermined portion of the chamber on which the substrate is mounted.

9. The method of claim 1, wherein forming the adsorption layer is performed in state of maintaining the surface of soft mold and the surface of pattern-formation material on the substrate at a predetermined interval therebetween.

10. The method of claim 9, wherein the pattern-formation material on the substrate is provided at an interval of 1 mm to 3 cm from the soft mold.

11. The method of claim 1, wherein the pattern layer is photo-cured when forming the pattern layer with the shape being inverted to the embossing and depressed patterns included in the surface of soft mold by bring the soft mold including the adsorption layer into contact with the remaining pattern-formation material.

12. The method of claim 11, wherein the pattern layer formed by photo-curing includes an adsorption layer on the surface of soft mold, and the remaining pattern-formation material on the substrate.

13. The method of claim 1, wherein one of the pattern-formation material and the soft mold has the hydrophilic interfacial property, and the other thereof has the hydrophobic property.

14. The method of claim 13, wherein the pattern-formation material is comprised of hydrophilic liquid pre-polymer of photo-curable property, photo-initiator and surfactant.

15. The method of claim 14, wherein the soft mold is formed of PDMS(polydimethylsiloxane) or polyurethane.

16. The method of claim 14, wherein the hydrophilic liquid pre-polymer of photo-curable property includes at least any one of HEA(2-Hydroxyehyl acrylate), EGDMA(Ethyleneglycol dimethancrylate), EGPEA(Ethyleneglycol phenyletheracrylate), HPA(Hydroxypropyl acrylate), and HPPA (Hydroxyl phenoxypropyl acrylate).

* * * * *